(12) United States Patent
Chu et al.

(10) Patent No.: US 9,091,273 B2
(45) Date of Patent: Jul. 28, 2015

(54) CONTROLLING CIRCUIT FOR OUTPUTTING A SQUARE WAVE SIGNAL TO CONTROL A FAN ROTATING SPEED

(71) Applicants: INVENTEC (PUDONG) TECHNOLOGY CORPORATION, Shanghai (CN); INVENTEC CORPORATION, Taipei (TW)

(72) Inventors: Fang-Jie Chu, Shanghai (CN); Cheng Wang, Shanghai (CN); Xiao-Gang Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 8 days.

(21) Appl. No.: 14/219,132

(22) Filed: Mar. 19, 2014

(65) Prior Publication Data

US 2015/0145458 A1    May 28, 2015

(30) Foreign Application Priority Data

Nov. 28, 2013  (CN) .......................... 2013 1 0627519

(51) Int. Cl.
*H02P 7/00* (2006.01)
*F04D 27/00* (2006.01)
*H03K 3/36* (2006.01)
*H02P 6/08* (2006.01)

(52) U.S. Cl.
CPC ................ *F04D 27/004* (2013.01); *H02P 6/08* (2013.01); *H03K 3/36* (2013.01)

(58) Field of Classification Search
CPC ....... H01S 3/09702; H02P 6/145; H02P 3/22; H02P 7/29
USPC ......... 318/452, 129, 130, 132, 133, 484, 268, 318/283, 284, 285, 599, 400.13; 388/829, 388/839, 840, 856, 858
See application file for complete search history.

(56) References Cited

U.S. PATENT DOCUMENTS

| 4,588,934 | A | * | 5/1986 | Suzuki et al. ................. 318/449 |
| 5,315,221 | A | * | 5/1994 | Corey ............................ 318/434 |
| 6,806,673 | B2 | * | 10/2004 | Ho ................................. 318/599 |
| 7,218,846 | B2 | * | 5/2007 | Wu et al. ................... 318/400.14 |
| 7,580,617 | B2 | * | 8/2009 | Yabe ............................. 388/811 |

* cited by examiner

*Primary Examiner* — Bentsu Ro
*Assistant Examiner* — Thai Dinh
(74) *Attorney, Agent, or Firm* — Bacon & Thomas, PLLC

(57) ABSTRACT

A controlling circuit for outputting a square wave circuit to control a fan rotating speed is disclosed, where an output unit continuously outputs the square wave signal and the output unit is electrically connected to a time-delaying adjustment circuit, so that a duty-ratio formed not equal to 50% is outputted to control the fan rotating speed, whereby a particular duty-ratio is provided to control the fan rotating speed after a control chip for fan rotating speed is pulled out.

16 Claims, 4 Drawing Sheets

CONTROLLING CIRCUIT FOR OUTPUTTING A SQUARE WAVE SIGNAL TO CONTROL A FAN ROTATING SPEED

BACKGROUND OF THE RELATED ART

1. Technical Field

The present invention relates to a controlling circuit, and particularly to a controlling circuit for outputting a square wave signal to control a fan rotating speed.

2. Related Art

Recent years, with wide prevalence and vigorous development of semiconductor technology, various electronic devices have boomed on market. Since some waste heat may generate in operation, a fan is typically provided to exhaust the heat.

Generally, a conventional fan is controlled by controlling a drive signal so that the fan exhausts the heat at a full speed. However, the waste heat generated from the electronic device varies with different loads. If the fan operates at the full speed, not only lifetime of the fan reduces, unnecessary waste of electricity source may be unavoidable, the issue of incapability of fan rotating speed control arises correspondingly.

In response, there has been a manner of transmitting a pulse width modulation by using a control chip proposed. However, in the case where the control chip for transmitting the pulse width modulation is pulled out or damaged, the fan may stop operating or cannot continue to adjust a duty-ratio of a square wave signal as desired to control the fan rotating speed.

In view of the above, it may be known that there has been the issue in the prior art that the duty-ratio of the square wave signal may not be adjusted as desired. Therefore, there is quite a need to set forth an improvement means to settle down this problem.

SUMMARY

The present invention discloses a controlling circuit for outputting a square wave signal to control a fan rotating speed.

According to a first embodiment of the present invention, the controlling circuit for outputting a square wave signal to control a fan rotating speed, comprising a time-delaying adjustment circuit, comprising a first circuit branch and a second circuit branch in parallel, the first circuit branch comprising a first resistor, the second circuit branch comprising a second resistor, and the time-delaying circuit being grounded through a capacitor; and an outputting unit, for continuously outputting the square wave signal to control the fan rotating speed, an output end of the outputting unit connected to a control end thereof and the capacitor both through the time-delaying adjustment circuit, and the time-delaying adjustment circuit and the grounded capacitor forming a resistor-capacitor time-delaying circuit for the outputting unit, wherein the second circuit branch is unilaterally conducting on and has a first state and a second state, and the first state being a conducting on state and the second state being an open state or the first state being an open state and the second state being a conducting on state; when the output end outputs a high level, the second circuit branch is at the first state and the capacitor is charged through a time delayed by the resistance-capacitance time-delaying circuit, so that a level of the control end increases gradually to the high level to make the output end change to output a low level; when the output end outputs the low level, the second circuit branch is at the second state and the capacitor is discharged through a time delayed by the resistance-capacitance delaying circuit so that the level of the control end decreases gradually to the low level to make the output end change to output the high level; an equivalent resistance of the first and second circuit branches in parallel when the output end outputs the high level is different from an equivalent resistance of the first and second circuit branches in parallel when the output end outputs the low level, leading to a time constant of the resistance-capacitance time-delaying circuit when the output end outputs the high level is different from a time constant of the resistance-capacitance time-delaying circuit when the output end outputs the low level, so that the square signal output by the output end has a duty-ratio being other than 50%.

In an embodiment, the second circuit branch further comprises a diode connected in series with the second resistor, the second circuit branch being conducted on when the diode conducts on, the second circuit branch being open when the diode turns off, so that the equivalent resistance of the first and second circuit branches in parallel when the diode conducts on is different from the equivalent resistance of the first and second circuit branches in parallel when the diode turns off.

In an embodiment, the diode is turned off when the output end outputs a high level and the diode is conducted on when the output end outputs a low level, so that the duty-ratio of the square wave signal is larger than 50%.

In an embodiment, the diode is conducted on when the output end outputs a high level and the diode is turned off when the output end outputs a low level, so that the duty-ratio of the square wave signal is less than 50%.

In an embodiment, the second resistor is a variable resistance, so that the duty-ratio of the square wave signal outputted from the output end is adjusted when the variable resistance of the second resistor varies.

In an embodiment, the control circuit further comprises a square wave duty-ratio adjustment module connected with the output end, the square wave duty adjustment module receiving the square wave signal outputted from the output end and outputting another square signal, and the duty-ratio of the square wave signal outputted from the output end plus the duty-ratio of the square wave signal outputted from the square module duty adjustment module equaling 1.

In an embodiment, the output unit is one of an inverter and a comparator.

In an embodiment, the duty-ratio of the square wave signal is a proportion of the lasting time of the square wave signal at the high level in the total lasting time of the square wave signal at the high and low levels.

According to a second embodiment of the present invention, the controlling circuit for outputting a square wave signal to control fan rotating speed, comprising a time-delaying adjustment circuit, comprising a first circuit branch and a second circuit branch in parallel, the first circuit branch comprising a first resistor, the second circuit branch comprising a second resistor, and the time-delaying circuit being grounded through a capacitor; and an outputting unit, for continuously outputting the square wave signal to control the fan rotating speed, an output end of the outputting unit connected to a control end thereof and the capacitor both through the time-delaying adjustment circuit, wherein the second circuit branch is unilaterally conducting on and has a first state and a second state, and the first state being a conducting on state and the second state being an open state or the first state being an open state and the second state being a conducting on state, when the output end outputs a high level, the second branch is at the first state and a level of the control end gradually increases to the high level through a first delay time to make the output end change to output a low level, so that the capacitor begins to be discharged and the second circuit branch changes to the second state, and when the output end outputs the low level, the level of the control end decreases gradually to the low level through a second delay time to make the output end change to output the high level, so that the capacitor begins to be charged and the second circuit branch changes to the second state, the first delay time is different from the second delay time.

In an embodiment, the second circuit branch further comprises a diode connected in series with the second resistor, the second circuit branch being conducted on when the diode conducts on, the second circuit branch being open when the diode turns off, so that the equivalent resistance of the first and second circuit branches in parallel is different when the diode conducts on and turns off.

In an embodiment, the diode is turned off when the output end outputs a high level while the diode is turned on when the output end outputs a low level, so that the duty-ratio of the square wave signal is larger than 50%.

In an embodiment, the second resistor is a variable resistance, so that the duty-ratio of the square wave signal outputted from the output end is adjusted when the variable resistance of the second resistor varies.

In an embodiment, the diode is conducted on when the output end outputs a high level and the diode is turned off when the output end outputs a low level, so that the duty-ratio of the square wave signal is less than 50%.

In an embodiment, the control circuit further comprises a square wave duty-ratio adjustment module connected with the output end, the square wave duty adjustment module receiving the square wave signal outputted from the output end and outputting another square signal, and the duty-ratio of the square wave signal outputted from the output end plus the duty-ratio of the square wave signal outputted from the square module duty adjustment module equaling 1.

In an embodiment, the output unit is one of an inverter and a comparator.

In an embodiment, the duty-ratio of the square wave signal is a proportion of the lasting time of the square wave signal at the high level in the total lasting time of the square wave signal at the high and low levels.

The circuit of the present invention has the difference as compared to the prior art that the resistor-capacitor time-delaying circuit connected with the output unit has the second circuit branch unilaterally conducting, so that the high and low levels at the output end have different lasting time, and thus the duty-ratio formed by the high and low levels at the output end is not equal to 50% of the square wave signal to control the fan rotating speed.

By using the above technical means, the present invention settles down the issue of poor control of the fan rotating speed after a control chip is pulled out.

BRIEF DESCRIPTION OF THE DRAWINGS

The invention will become more fully understood from the detailed description given herein below illustration only, and thus is not limitative of the present invention, and wherein.

DETAILED DESCRIPTION

The present invention will be apparent from the following detailed description, which proceeds with reference to the accompanying drawings, wherein the same references relate to the same elements.

Prior to the description of a controlling circuit for outputting a square wave signal to control a fan rotating speed of the present invention, an application environment onto which the present invention is used is described first. The fan requires a power supplied for its rotation, and thus a power supply circuit (which is conventional and thus not shown in the figure) is provided for this purpose. The controlling circuit in this invention outputs a square wave signal to control the power supply circuit to power up the fan, whereby controlling the fan rotating speed by adjusting the duty-ratio of the square wave signal.

Figure 1:
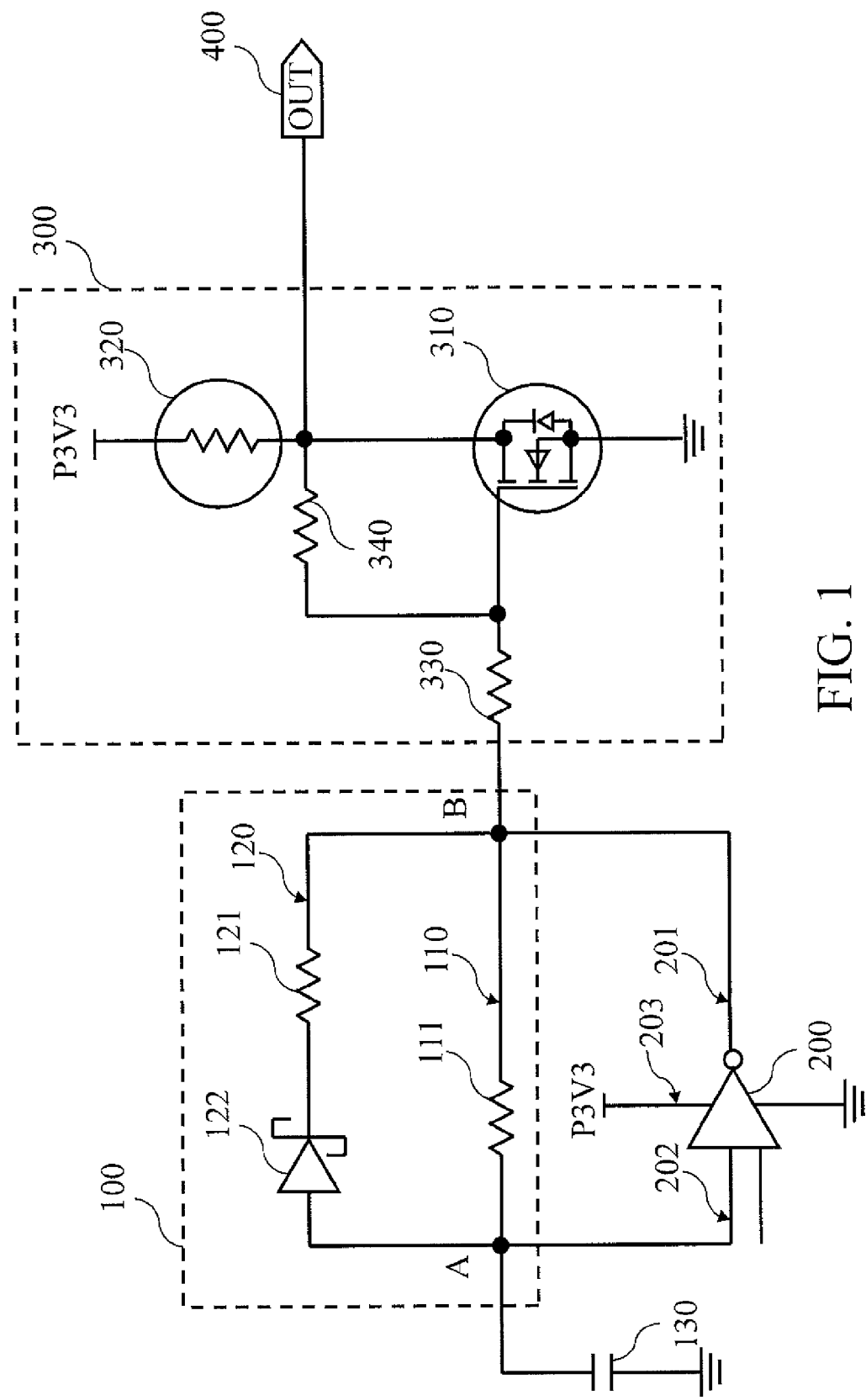
FIG. 1 is a schematic diagram of a controlling circuit for outputting a square wave signal to control a fan rotating speed connected with a square wave duty-ratio adjustment module according to the present invention.
Figure 2:
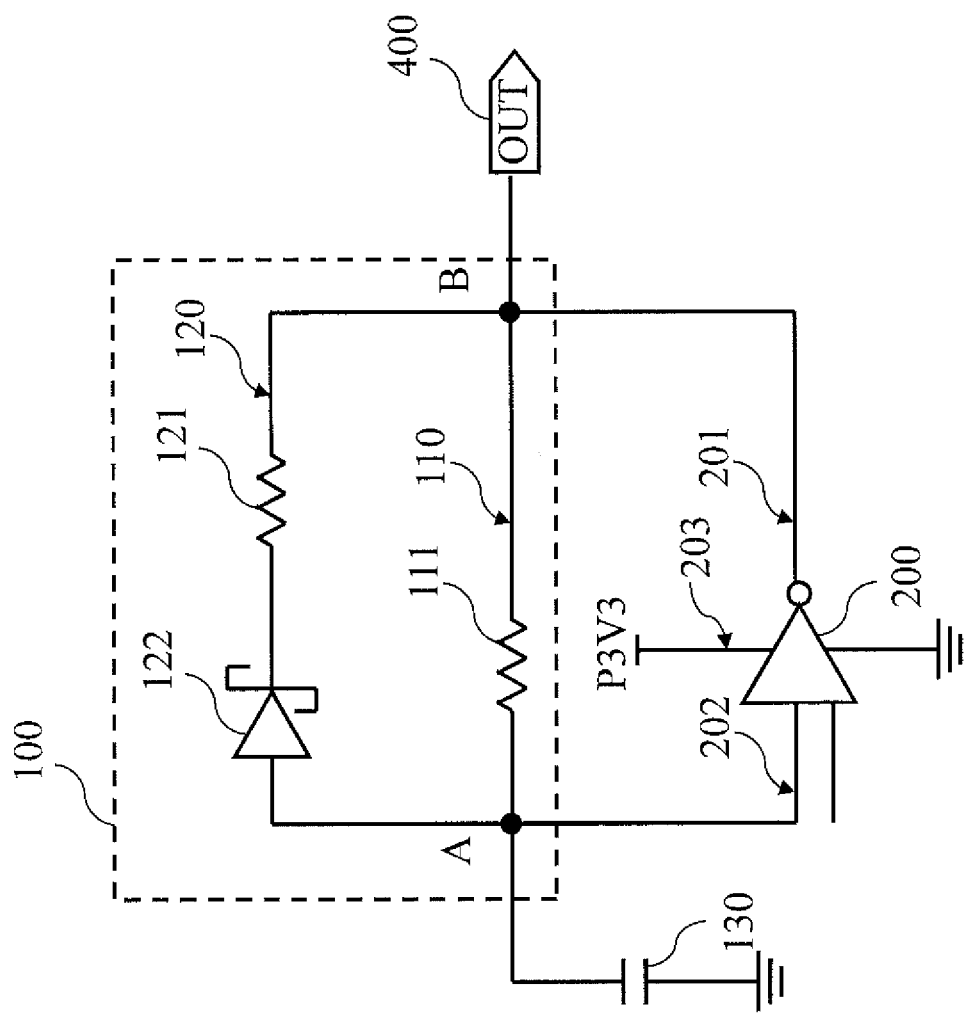
FIG. 2 is a schematic diagram of a controlling circuit for outputting a square wave signal to control a fan rotating speed having not connected with a square wave duty-ratio adjustment module according to the present invention.

In the following, the controlling circuit for outputting a square wave signal to control a fan rotating speed of the present invention will be further described with reference to the figures. FIG. 1 is a schematic diagram of a controlling circuit for outputting a square wave signal to control a fan rotating speed connected with a square wave duty-ratio adjustment module according to the present invention. FIG. 2 is a schematic diagram of a controlling circuit for outputting a square wave signal to control a fan rotating speed having not connected with a square wave duty-ratio adjustment module according to the present invention.

In FIG. 2, an output end 201 is directly connected to a signal output end 400. The controlling circuit of the present invention comprises a time-delaying circuit 100, a capacitor 130 and an output unit 200. The time-delaying circuit 100 comprises a first circuit branch 110 and a second circuit branch 120 arranged in parallel. The first circuit branch 110 comprises a first resistor 111, the second circuit branch 120 comprises a second resistor 121, and the time-delaying circuit 100 is grounded through the capacitor 130. The second circuit branch 120 also comprises a diode 122 arranged in series with the second resistor 121. When the diode 122 is on, it is indicated that the second circuit branch 120 conducts on. Otherwise, when the diode 122 does not conduct on, the second circuit branch 120 is opened.

In this embodiment, the diode 122 is used to unilaterally conduct the second circuit 120 by means of its unilaterally conducting property. In the case of conducting and non-conducting states of the diode 122, the first circuit branch 110 and the second circuit branch 120 in parallel have different equivalent resistances, respectively, as shown in FIG. 1. Assume the first resistance 120 has a resistance value r1, the second resistance 121 has a resistance value r2, the second circuit branch 120 conducts on when the diode 122 is on. The first and second circuit branches 110, 120 in parallel jointly have an equivalence resistance r1*r2/(r1+r2). When the diode 122 is not on, the equivalent resistance of the second circuit branch 120 is indefinite, the equivalent resistance of the first and second circuit branches 110, 120 equates the resistance of the first resistor 111, r1>r1*r2/(r1+r2), since the second circuit branch 120 is now opened.

As shown in FIG. 1, when the output end 201 outputs a high level, the level at point B is higher than that At point A. At this time, the capacitor 130 is charged, the diode 122 is off, resulting in an open state of the second circuit branch 120. When the output end 201 outputs a low level, the charged capacitor 130 discharges. At this time, the level at point B is lower than that at point A, the diode 122 is on, resulting in a conducting on state of the second circuit branch 120. If the diode 122 is inversely connected, a cathode of the diode 122 is connected to point A, and an anode is connected to the resistor 121. At this time, the second circuit branch 120 conducts on when the output end 201 outputs a high level, and becomes off when the output end 201 outputs a low level and the final output end 201 outputs the square wave signal having its duty-ratio smaller than 50%. As afro-mentioned, the diode 122 is not inversely connected, the duty-ratio of the square wave signal outputted from the output end 201 is larger than 50% as shown in FIG. 1 and FIG. 2. In addition, the second resistance 121 may be a variable resistor, for adjusting the duty-ratio of the square wave signal outputted at the output end 201 when the second resistance varies.

The output unit 200 is used to continuously output the square wave signal to control the fan rotating speed. The output end 201 of the output unit 200 is connected to the control end 202 and the capacitor 130 of the output unit 200 through the time-delaying adjustment circuit 100, respectively. The time-delaying adjustment circuit 100 and the grounded capacitor 130 form jointly a resistor-capacitor time-delaying circuit (RC time-delaying circuit) of the output unit 200.

The level at the output end 201 is certainly affected by the level at the control end 202. Namely, when the level at the control end 202 is high, the output end 201 of the output unit 200 outputs low, until the level at the control end 202 reduces to low from high, causing the output end 201 of the output unit 200 to rise high. In real implementation, the output unit 200 may use an inverter or a comparator, and even use an operational amplifier or a logic gate for implementation. As to the case where the comparator is used as an inverter circuit, its real connection may be schematically known by referring to FIG. 1 and FIG. 2. A power source end 203 is connected to a 3.3V power to maintain the output unit 200 in operation and one end of the output unit 200 is grounded. And, the control end 202 is electrically connected to point A and the output end 201 is electrically connected to point B.

As afro-mentioned, the second circuit branch 120 unilaterally conducts on, and has a first state and a second state inversed to the first state. Namely, the first state is a conducting-on state while the second state is an open state, or the first state is an open state while the second state is a conducting-on state. When the output end 201 outputs a high level, the second circuit branch 120 stays at the first state (the open state for the embodiment associated with FIG. 1 and FIG. 2. If the diode 122 shown in FIG. 1 and FIG. 2 is inversely connected, the first state is conducting-on state), and the capacitor 130 is charged. The level at control end 202 gradually rises owing to the time delayed by the resistor-capacitor time-delaying circuit, until the level at the output end 201 becomes low. When the level at the output end 201 becomes low, the charged capacitor 130 discharges, and the second circuit branch 120 becomes the second state (the conducting-on state for the embodiment associated with FIG. 1 and FIG. 2. If the diode 122 shown in FIG. 1 and FIG. 2 is inversely connected, the first state is the open state). After the time delayed by the resistor-capacitor time-delaying circuit, the level at the control end 202 gradually reduces to low, and the level at the output end 201 becomes high again (this process repeats itself, i.e. the level at the output end 201 continuously outputs high-low-high-low-, resulting in a particular duty-ratio of a square wave signal).

When the second circuit branch 120 is at the conducting-on state and open state, respectively, the equivalent resistances of the combination of the first and second circuit branches 110, 120 in parallel are different, lending to different time constants t (t=r*c, i.e. the time constant is equal to the resistance value r of the time-delaying adjustment circuit 100 times the capacitor value c of the capacitor 130) of the resistor-capacitor time-delaying circuit, resulting in different time periods of the high and low levels at the output end 201 (the time period is essentially proportional to time constant), enabling the output end 201 to output adjusted square wave signal, i.e. the square wave signal having its duty-ratio not equal to 50%.

As such, the fan receives the adjusted square wave signal to adjust the corresponding rotating speed, where the adjusted square wave signal is a pulse width modulation (PWM) signal.

In the embodiment disclosed in FIG. 1 and FIG. 2, since the second circuit branch 120 conducts on when the output end 201 outputs a low level, the equivalent resistance of the first and second circuit branches 110, 120 in parallel is r1*r2/(r1+r2) at this time. A lasting time of low level at the output end 201 is proportional to t1=c*r1*r2/(r1+r2). When the output end 201 outputs a high level, the second circuit branch 120 is open. At this time, the equivalent resistance of the first and second circuit branches 110, 120 in parallel is equal to the resistance value r1 of the first resistor 111, and the lasting time of high level at the output end 201 is proportional to t2=c*r1, t2>t1. Thus, for the embodiment shown in FIG. 1 and FIG. 2, the duty-ratio of the square wave signal outputted at the output end 201 is larger than 50%, where the duty-ratio is a proportion of the lasting time at the high level in the total lasting time at the high and low levels.

In other embodiments, the diode 122 may be inversely connected, the proportion occupied by the high level will reduce down to below 50% and the low level is up to above 50% at this time. At this time, the second circuit branch 120 conducts on when the output end 201 outputs high. The first and second circuit branches 110, 120 in parallel have an equivalent resistance value of r1*r2/(r1+r2). The lasting time of high level at the output end 201 is proportional to t1=c*r1*r2/(r1+r2). When the output end 201 outputs low, the second circuit branch 120 is open. The equivalent resistance of the first and second circuit branches 110, 120 in parallel is equal to the resistance value r1 of the first resistor 111. The lasting time of low level at the output end 201 is proportional to t2=c*r1, t2>t1. Thus, after the diode 122 is inversely connected, the duty-ratio of the square wave signal outputted at the output end 201 is smaller than 50%, where the duty-ratio is a proportion of the lasting time at the high level and the total lasting time at the high and low levels.

It is to be particularly pointed out that the inventive circuit may further comprise a square wave duty-ratio adjustment module 300 connected to the output end 201. The square wave duty-ratio adjustment module 300 receives the square wave signal outputted from the output end 201 and outputs another square wave signal. The duty-ratios of the square wave signal outputted from the output end 201 and from the duty-ratio adjustment module 300 are summed to one. In real implementation, the square wave duty-ratio adjustment module 300 may comprise a transistor 310 and a third resistor 320. A 3.3V power is connected to a signal output end 400 and the transistor 310 through the third resistor 320. The transistor 310 is triggered to conduct on upon receiving the high level outputted from the output end 201, and thus the voltage at the signal output end 400 is pulled low, enabling the signal output end 400 to output low. When the transistor 310 receives the low level at the output end 201, it is not conducted on, enabling the signal output end 400 outputs high. In essential, the square wave adjustment module 300 is commensurate to an inverter circuit. When the square wave adjustment module 300 receives a high level, it outputs low and when the square wave duty-ratio adjustment module 300 receives a low level, it outputs high. When the transistor 310 and the third resistor 320 are taken off, the output end 201 is directly electrically connected to the signal output end 400 through resistors 330, 340, to output the square wave signal.

Figure 3:
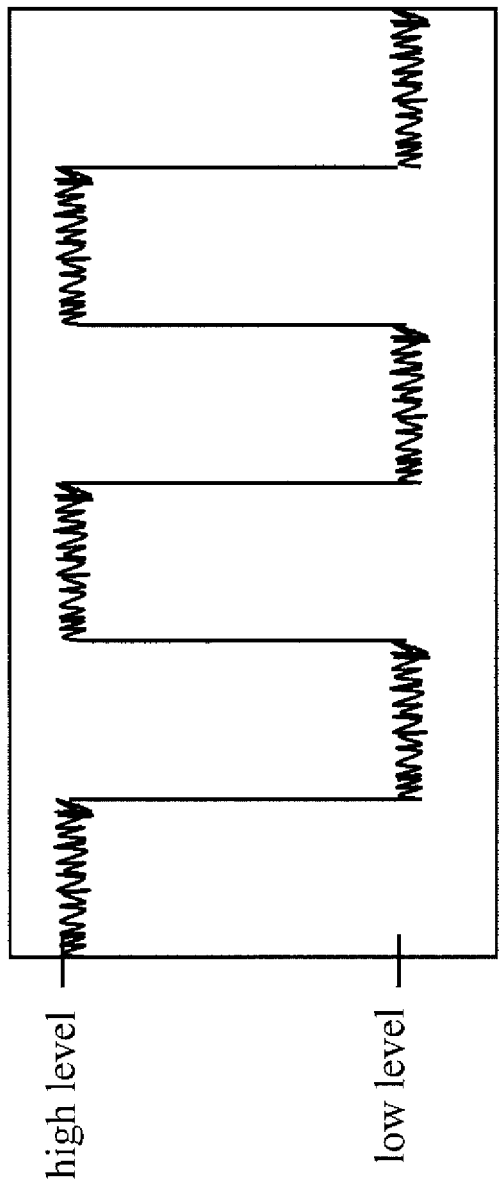
FIG. 3 is a schematic diagram of a the square wave signal outputted from the controlling circuit deducting a second circuit branch according to the present invention.
Figure 4:
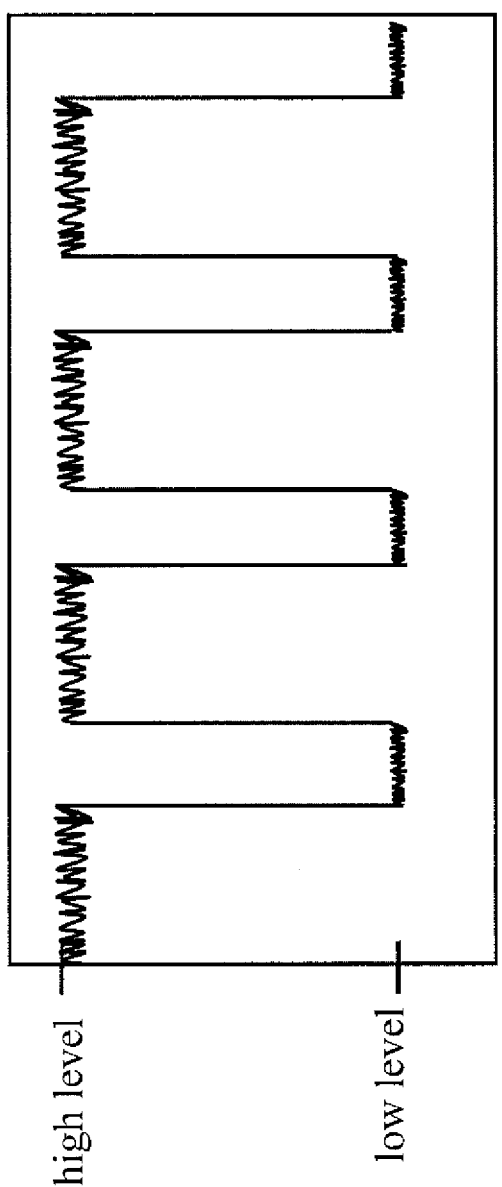
FIG. 4 is a schematic diagram of the square wave circuit outputted from the controlling circuit according to the present invention.

Thereafter, referring to FIG. 3 and FIG. 4, where FIG. 3 is a schematic diagram of a the square wave signal outputted from the controlling circuit deducting the second circuit branch according to the present invention. FIG. 4 is a schematic diagram of the square wave circuit outputted from the controlling circuit (including the second circuit branch) according to the present invention. At first, after the second circuit branch is removed from the controlling circuit in FIG. 2, the output end 201 of the output unit 200 may continuously output the square wave signal having its duty-ratio of 50%, as is shown in FIG. 3. As to the controlling circuit (including the second circuit branch 120) shown in FIG. 2, since the existence of the unilaterally conducting second circuit branch 120, the output end 201 outputs a low level for a lasting time proportional to $t1=c*r1*r2/(r1+r2)$, and the output end 201 outputs a high level for a lasting time proportional to $t2=c*r1$, $t2=2*t1$ Hence, the duty-ratio of the square wave signal at the output end 201 is 66.7%, i.e. ⅔(assuming r1 equal r2), resulting further in the square wave signal diagram shown in FIG. 4

In this invention, since the second circuit branch 120 of the time-delaying adjustment circuit 100 conducts unilaterally on, the state of the second circuit branch 120 is changed when the output end 201 outputs high or low. Thus, the time-delaying adjustment circuit 100 has different equivalent resistances when the output end 2012 outputs high or low, and thus the resistor-capacitance time-delaying circuit has different time constants when the output end 201 outputs high and low, respectively. This results in the different lasting time of high and low levels at the output end 201, enabling a square wave signal having its duty-ratio does not equate 50% to be generated.

In summary, it may be known that the present invention has the difference as compared to the prior art that the resistor-capacitor time-delaying circuit connected with the output unit has the second circuit branch unilaterally conducting on, so that the high and low levels at the output end have different lasting time, and thus the duty-ratio formed by the high and low levels at the output end is not equal to 50% of the square wave signal to control the fan rotating speed.

By using the above technical means, the present invention settles down the issue of poor control of the fan rotating speed after a control chip is pulled out.

By using the second resistance having a different resistance, the square wave signal having a different duty-ratio is obtained, and a desired fan rotating speed is correspondingly obtained. When the duty-ratio of the square wave signal outputted at the output end is required to be adjusted, it may be implemented by varying the equivalent resistance of the second circuit branch when conducting, such as by adjusting the resistance value of the second resistance (in the case that the second resistor has an adjustable resistance) or replacing the second resistance with another resistance value, whereby achieving the technical efficacy of adjustable duty-ratio.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A controlling circuit for outputting a square wave signal to control a fan rotating speed, comprising:
   a time-delaying adjustment circuit, comprising a first circuit branch and a second circuit branch in parallel, the first circuit branch comprising a first resistor, the second circuit branch comprising a second resistor, and the time-delaying circuit being grounded through a capacitor; and
   an outputting unit, for continuously outputting the square wave signal to control the fan rotating speed, an output end of the outputting unit connected to a control end thereof and the capacitor both through the time-delaying adjustment circuit, and the time-delaying adjustment circuit and the grounded capacitor forming a resistor-capacitor time-delaying circuit for the outputting unit,
   wherein the second circuit branch is unilaterally conducting on and has a first state and a second state, and the first state being a conducting on state and the second state being an open state or the first state being an open state and the second state being a conducting on state; when the output end outputs a high level, the second circuit branch is at the first state and the capacitor is charged through a time delayed by the resistance-capacitance time-delaying circuit, so that a level of the control end increases gradually to the high level to make the output end change to output a low level; when the output end outputs the low level, the second circuit branch is at the second state and the capacitor is discharged through a time delayed by the resistance-capacitance delaying circuit so that the level of the control end decreases gradually to the low level to make the output end change to output the high level; an equivalent resistance of the first and second circuit branches in parallel when the output end outputs the high level is different from an equivalent resistance of the first and second circuit branches in parallel when the output end outputs the low level, leading to a time constant of the resistance-capacitance time-delaying circuit when the output end outputs the high level is different from a time constant of the resistance-capacitance time-delaying circuit when the output end outputs the low level, so that the square signal output by the output end has a duty-ratio being other than 50%.

2. The controlling circuit as claimed in claim 1, wherein the second circuit branch further comprises a diode connected in series with the second resistor, the second circuit branch being conducted on when the diode conducts on, the second circuit branch being open when the diode turns off, so that the equivalent resistance of the first and second circuit branches in parallel when the diode conducts on is different from the equivalent resistance of the first and second circuit branches in parallel when the diode turns off.

3. The controlling circuit as claimed in claim 2, wherein the diode is turned off when the output end outputs a high level and the diode is conducted on when the output end outputs a low level, so that the duty-ratio of the square wave signal is larger than 50%.

4. The controlling circuit as claimed in claim 2, wherein the diode is conducted on when the output end outputs a high level and the diode is turned off when the output end outputs a low level, so that the duty-ratio of the square wave signal is less than 50%.

5. The controlling circuit as claimed in claim 1, wherein the second resistor is a variable resistance, so that the duty-ratio of the square wave signal outputted from the output end is adjusted when the variable resistance of the second resistor varies.

6. The controlling circuit as claimed in claim 1, wherein the control circuit further comprises a square wave duty-ratio adjustment module connected with the output end, the square wave duty adjustment module receiving the square wave signal outputted from the output end and outputting another square signal, and the duty-ratio of the square wave signal outputted from the output end plus the duty-ratio of the square wave signal outputted from the square module duty adjustment module equaling 1.

7. The controlling circuit as claimed in claim 1, wherein the output unit is one of an inverter and a comparator.

8. The controlling circuit as claimed in claim 1, wherein the duty-ratio of the square wave signal is a proportion of the lasting time of the square wave signal at the high level in the total lasting time of the square wave signal at the high and low levels.

9. A controlling circuit for outputting a square wave signal to control fan rotating speed, comprising:
   a time-delaying adjustment circuit, comprising a first circuit branch and a second circuit branch in parallel, the first circuit branch comprising a first resistor, the second circuit branch comprising a second resistor, and the time-delaying circuit being grounded through a capacitor; and
   an outputting unit, for continuously outputting the square wave signal to control the fan rotating speed, an output end of the outputting unit connected to a control end thereof and the capacitor both through the time-delaying adjustment circuit;
   wherein the second circuit branch is unilaterally conducting on and has a first state and a second state, and the first state being a conducting on state and the second state being an open state or the first state being an open state and the second state being a conducting on state; when the output end outputs a high level, the second branch is at the first state and a level of the control end gradually increases to the high level through a first delay time to make the output end change to output a low level, so that the capacitor begins to be discharged and the second circuit branch changes to the second state, and when the output end outputs the low level, the level of the control end decreases gradually to the low level through a second delay time to make the output end change to output the high level, so that the capacitor begins to be charged and the second circuit branch changes to the second state; the first delay time is different from the second delay time.

10. The controlling circuit as claimed in claim 9, wherein the second circuit branch further comprises a diode connected in series with the second resistor, the second circuit branch being conducted on when the diode conducts on, the second circuit branch being open when the diode turns off, so that the equivalent resistance of the first and second circuit branches in parallel is different when the diode conducts on and turns off.

11. The controlling circuit as claimed in claim 10, wherein the diode is conducted on when the output end outputs a high level and the diode is turned off when the output end outputs a low level, so that the duty-ratio of the square wave signal is less than 50%.

12. The controlling circuit as claimed in claim 9, wherein the diode is turned off when the output end outputs a high level while the diode is turned on when the output end outputs a low level, so that the duty-ratio of the square wave signal is larger than 50%.

13. The controlling circuit as claimed in claim 9, wherein the second resistor is a variable resistance, so that the duty-ratio of the square wave signal outputted from the output end is adjusted when the variable resistance of the second resistor varies.

14. The controlling circuit as claimed in claim 9, wherein the control circuit further comprises a square wave duty-ratio adjustment module connected with the output end, the square wave duty adjustment module receiving the square wave signal outputted from the output end and outputting another square signal, and the duty-ratio of the square wave signal outputted from the output end plus the duty-ratio of the square wave signal outputted from the square module duty adjustment module equaling 1.

15. The controlling circuit as claimed in claim 9, wherein the output unit is one of an inverter and a comparator.

16. The controlling circuit as claimed in claim 9, wherein the duty-ratio of the square wave signal is a proportion of the lasting time of the square wave signal at the high level in the total lasting time of the square wave signal at the high and low levels.

* * * * *